(12) United States Patent
Kojima et al.

(10) Patent No.: US 11,437,564 B2
(45) Date of Patent: Sep. 6, 2022

(54) ULTRASONIC DEVICE AND ULTRASONIC APPARATUS

(71) Applicant: Seiko Epson Corporation, Tokyo (JP)

(72) Inventors: Chikara Kojima, Matsumoto (JP); Koji Ohashi, Matsumoto (JP); Hironori Suzuki, Chino (JP)

(73) Assignee: Seiko Epson Corporation

( * ) Notice: Subject to any disclaimer, the term of this patent is extended or adjusted under 35 U.S.C. 154(b) by 355 days.

(21) Appl. No.: 16/817,754

(22) Filed: Mar. 13, 2020

(65) Prior Publication Data

US 2020/0295251 A1 Sep. 17, 2020

(30) Foreign Application Priority Data

Mar. 15, 2019 (JP) .............................. JP2019-047989

(51) Int. Cl.
*H01L 41/113* (2006.01)
*H01L 41/053* (2006.01)
*H01L 41/047* (2006.01)

(52) U.S. Cl.
CPC ........ *H01L 41/1132* (2013.01); *H01L 41/047* (2013.01); *H01L 41/053* (2013.01)

(58) Field of Classification Search
CPC .............. H01L 41/1132; H01L 41/047; H01L 41/053; H01L 41/081; H01L 41/0973; B60B 1/0603; B60B 1/0629
See application file for complete search history.

(56) References Cited

U.S. PATENT DOCUMENTS

| 2012/0057728 | A1* | 3/2012 | Fujise | ..................... H04R 7/06 |
| | | | | 381/162 |
| 2013/0223657 | A1* | 8/2013 | Onishi | ................... H04R 17/00 |
| | | | | 310/334 |
| 2013/0259274 | A1* | 10/2013 | Hayashi | ............. H01L 41/0926 |
| | | | | 310/330 |
| 2016/0345934 | A1 | 12/2016 | Kojima | |

FOREIGN PATENT DOCUMENTS

JP 2015-118014 A 6/2015
JP 2017-009567 A 1/2017

* cited by examiner

*Primary Examiner* — Jeffrey M Shin
(74) *Attorney, Agent, or Firm* — Harness, Dickey & Pierce, P.L.C.

(57) ABSTRACT

An ultrasonic device includes a base member including a first surface and a second surface different from the first surface, a vibration plate provided at the first surface of the base member, and a piezoelectric element provided at the vibration plate. The base member includes a hole formed from the first surface to the second surface, and a wall portion surrounding the hole. The vibration plate includes, when viewed in a direction from the first surface toward the second surface, a supporting portion overlapping the wall portion, and a blocking portion that overlaps the hole and blocks the hole. The piezoelectric element is laminated at the blocking portion. The supporting portion has a first Young's modulus. The blocking portion includes a first blocking portion having the first Young's modulus and a second blocking portion having a second Young's modulus smaller than the first Young's modulus.

7 Claims, 10 Drawing Sheets

FIG. 10

| | YOUNG'S MODULUS (MPa) | THICKNESS OF RESIN LAYER (μm) | RESONANCE FREQUENCY | Q VALUE |
|---|---|---|---|---|
| COMPARATIVE EXAMPLE 1 | 30 | 20 | 415 | 16 |
| COMPARATIVE EXAMPLE 2 | 3000 | 3 | 810 | 49 |
| | | 5 | 1000 | 35 |
| | | 7 | 1250 | 35 |
| | | WIDTH OF SECOND BLOCKING PORTION (μm) | | |
| EMBODIMENT | 3000 | 3 | 548 | 135 |
| | | 10 | 438 | 108 |
| | | 25 | 382 | 54 |

ULTRASONIC DEVICE AND ULTRASONIC APPARATUS

The present application is based on, and claims priority from, JP Application Serial Number 2019-047989, filed Mar. 15, 2019, the disclosure of which is hereby incorporated by reference herein in its entirety.

BACKGROUND

1. Technical Field

The present disclosure relates to an ultrasonic device and an ultrasonic apparatus.

2. Related Art

In a related art, there has been known an ultrasonic device that transmits and receives ultrasonic waves using vibration of a vibration plate, and an ultrasonic apparatus including the ultrasonic device (for example, see JP-A-2015-118014).

An ultrasonic device described in JP-A-2015-118014 includes an ultrasonic sensor element. The ultrasonic sensor element includes a substrate with a hole formed therein, a vibration plate provided at the substrate to close the hole, and a piezoelectric element laminated at the vibration plate. A side of the vibration plate, at which the piezoelectric element is provided, is provided with a sealing plate, and a resin layer, in which ultrasonic diffusion particles are held, is provided between the sealing plate and the vibration plate. That is, the resin layer covers the piezoelectric element and the vibration plate.

In the ultrasonic device, when a plurality of ultrasonic sensor elements are arranged in an array, vibration propagation and ultrasonic propagation to an adjacent ultrasonic sensor element can be prevented, so that crosstalk can also be prevented.

However, when resin covers the piezoelectric element and the vibration plate, there are the following problems.

That is, in order to couple a signal line to the piezoelectric element, a part of the resin layer needs to be removed by etching to expose a part of the electrode portion provided at the vibration plate. At this time, if rigidity of the resin layer is low, accuracy of an etching process for exposing the electrode portion decreases, and reliability of the ultrasonic device decreases.

If the rigidity of the resin layer is increased, the accuracy of the etching process increases. However, in this case, the rigidity related to a deformation of the entire vibration plate also increases, so that a resonance frequency increases. It is conceivable to increase an opening diameter of the hole so as to lower the resonance frequency. However, in this case, an unnecessary vibration mode appears when the vibration plate is vibrated, the vibration of the vibration plate becomes unstable, and a performance of the ultrasonic device is degraded.

SUMMARY

An ultrasonic device according to a first application example includes a base member including a first surface and a second surface different from the first surface, a vibration plate provided at the first surface of the base member, and a piezoelectric element provided at the vibration plate. The base member includes a hole formed from the first surface to the second surface, and a wall portion surrounding the hole. The vibration plate includes, when viewed in a direction from the first surface toward the second surface, a supporting portion overlapping the wall portion, and a blocking portion that overlaps the hole and blocks the hole. The piezoelectric element is provided in the blocking portion. The supporting portion has a first Young's modulus. The blocking portion includes a first blocking portion having the first Young's modulus and a second blocking portion having a second Young's modulus smaller than the first Young's modulus.

In the ultrasonic device according to the application example, the second blocking portion may be provided in contact with a boundary between the blocking portion and the supporting portion.

In the ultrasonic device according to the application example, the second blocking portion may be provided at a peripheral edge of the piezoelectric element when viewed from the direction from the first surface toward the second surface.

In the ultrasonic device according to the application example, $10 \times (1+\gamma) \times W - 100 \leq S \leq (0.3\gamma+0.21) \times W$, in which $\gamma$ is an aspect ratio when the hole is viewed from the direction from the first surface toward the second surface, W is an opening width in a minor axis direction when the hole is viewed from the direction from the first surface toward the second surface, and S is a cross-sectional area that is a product of a thickness of the second blocking portion in the direction from the first surface toward the second surface and a width of the second blocking portion in the minor axis direction.

In the ultrasonic device according to the application example, the first blocking portion may include $SiO_2$, and the second blocking portion may be formed of an elastomer.

In the ultrasonic device according to the application example, the base member includes a plurality of the holes, and the vibration plate includes a plurality of the blocking portions corresponding to the respective holes.

An ultrasonic apparatus according to a second application example includes the ultrasonic device according to the first application example, and a control unit configured to control the ultrasonic device.

BRIEF DESCRIPTION OF THE DRAWINGS

FIG. 10 shows a resonance frequency and a Q value when a film thickness of an ultrasonic transducer according to the comparative example is changed, and a resonance frequency and a Q value when the width of the second blocking portion of the ultrasonic transducer according to the embodiment is changed.

DESCRIPTION OF EXEMPLARY EMBODIMENTS

Hereinafter, an embodiment will be described.

Figure 1:
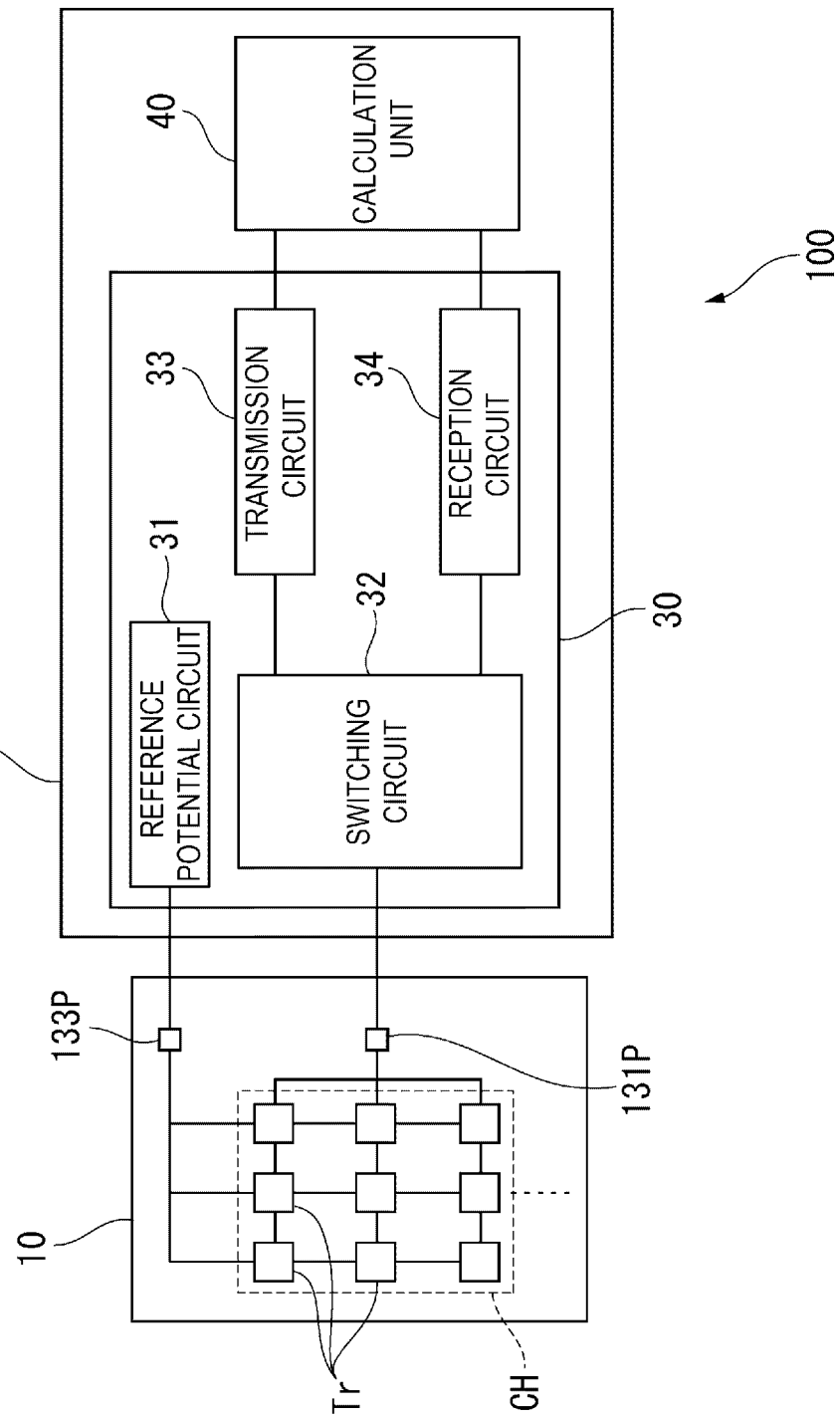
FIG. 1 is a block diagram showing a schematic configuration of an ultrasonic apparatus according to an embodiment.

FIG. 1 is a block diagram showing a schematic configuration of an ultrasonic apparatus 100 according to the embodiment.

As shown in FIG. 1, the ultrasonic apparatus 100 according to the embodiment includes an ultrasonic device 10, and a control unit 20 configured to control the ultrasonic device 10. In the ultrasonic apparatus 100 according to the embodiment, the control unit 20 controls the ultrasonic device 10 via a drive circuit 30, and transmits ultrasonic waves from the ultrasonic device 10. Then, when the ultrasonic waves are reflected by an object and reflected waves are received by the ultrasonic device 10, the control unit 20 calculates a distance from the ultrasonic device 10 to the object based on a time from a transmission timing of the ultrasonic waves to a reception timing of the ultrasonic waves.

Hereinafter, the configuration of the ultrasonic apparatus 100 will be specifically described.

Configuration of Ultrasonic Device 10

Figure 2:
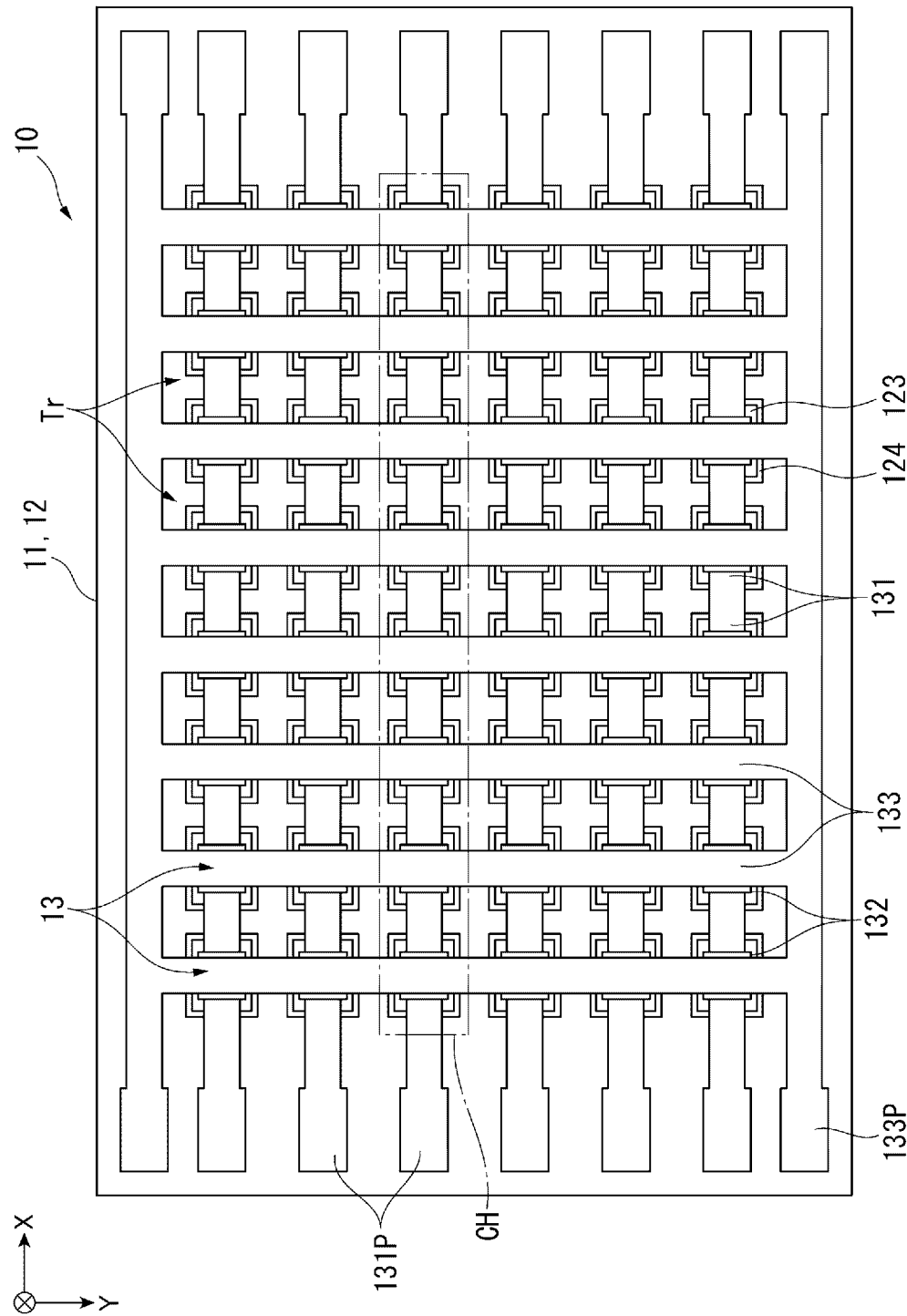
FIG. 2 is a schematic plan view illustrating an ultrasonic device according to the embodiment.
Figure 3:
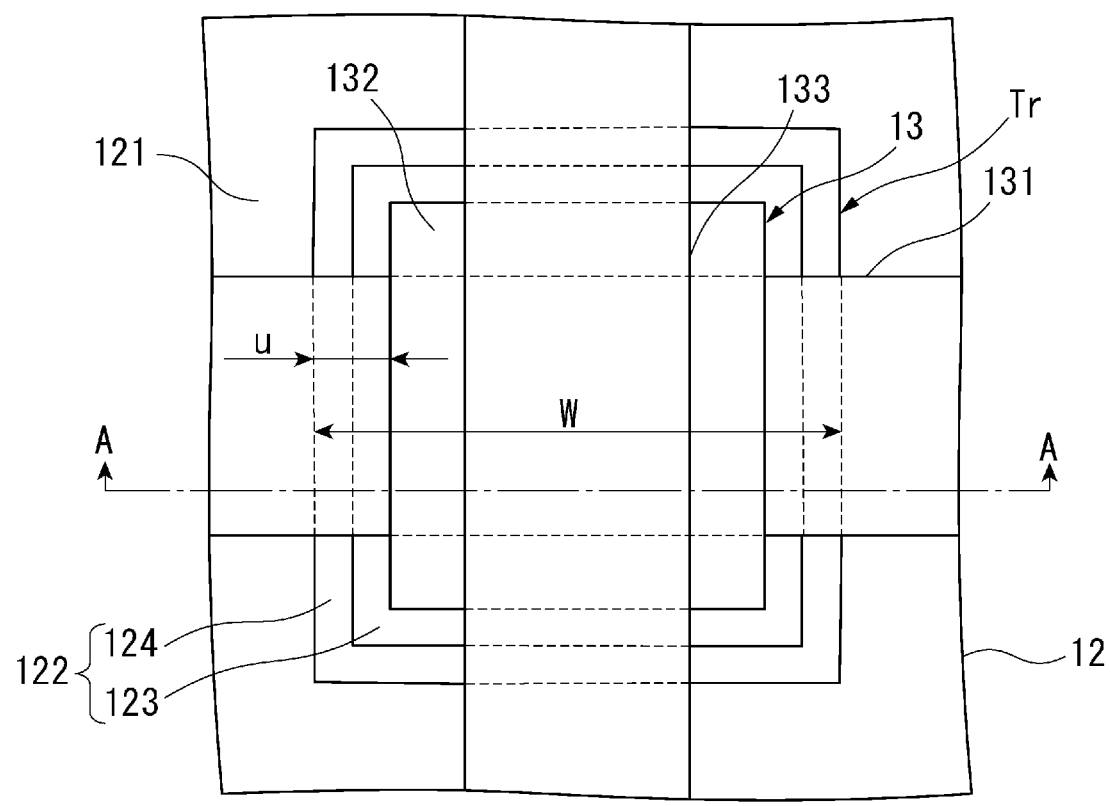
FIG. 3 is an enlarged plan view in which an ultrasonic transducer according to the embodiment is enlarged.
Figure 4:
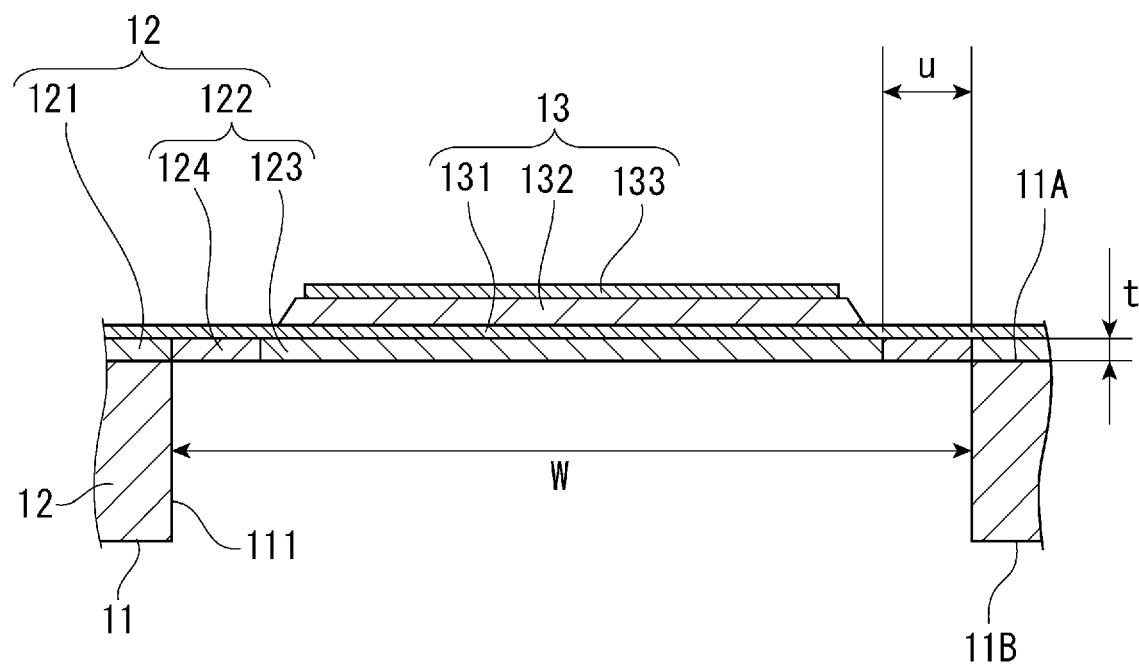
FIG. 4 is a cross-sectional view of the ultrasonic transducer taken along a line A-A in FIG. 3.

FIG. 2 is a schematic plan view illustrating the ultrasonic device 10. FIG. 3 is an enlarged plan view in which one of a plurality of ultrasonic transducers Tr illustrated in FIG. 2 is enlarged. FIG. 4 is a cross-sectional view of the ultrasonic transducer Tr taken along a line A-A in FIG. 3.

As shown in FIG. 4, the ultrasonic device 10 includes an element substrate 11 which is a base member, a vibration plate 12, and a piezoelectric element 13.

Configuration of Element Substrate 11

The element substrate 11 is formed of a semiconductor substrate which is Si or the like, and has a predetermined thickness for supporting the vibration plate 12. The element substrate 11 includes a first surface 11A and an opposite-side second surface 11B of the element substrate 11 from the first surface 11A. Here, in the following description, a direction from the first surface 11A toward the second surface 11B is referred to as a Z direction, a direction orthogonal to the Z direction is referred to as an X direction, and a direction orthogonal to the X direction and the Z direction is referred to as a Y direction. The first surface 11A and the second surface 11B are parallel to an XY plane. In the embodiment, as an example, an example in which the Y direction is orthogonal to the X direction is shown. However, the Y direction may be inclined at an angle other than 90° with respect to the X direction. In the following description, the X direction, the Y direction, and the Z direction that do not include an orientation may also be referred to as a direction.

The element substrate 11 is formed with a plurality of holes 111 arranged in a two-dimensional array along the X direction and the Y direction. These holes 111 are through holes penetrating the element substrate 11 in the Z direction from the first surface 11A to the second surface 11B.

The vibration plate 12 is provided at the first surface 11A of the element substrate 11, and an opening end of the hole 111 on a −Z side is blocked by the vibration plate 12. That is, a part of the element substrate 11, at which the hole 111 is not formed, is a wall portion 112, and the vibration plate 12 is laminated on the wall portion 112.

Configuration of Vibration Plate 12

As described above, the vibration plate 12 is provided on the first surface 11A of the element substrate 11. A thickness of the vibration plate 12 is sufficiently smaller than that of the element substrate 11.

Here, a part of the vibration plate 12 that is laminated on the wall portion 112 is a supporting portion 121, and a part of the vibration plate 12 that blocks the hole 111 is a blocking portion 122. The ultrasonic transducer Tr includes the blocking portion 122 and the piezoelectric element 13.

The blocking portion 122 includes a first blocking portion 123 and a second blocking portion 124. When viewed from the Z direction, the second blocking portion 124 is provided along an outer peripheral edge of the blocking portion 122. The first blocking portion 123 is provided inside the second blocking portion 124, and the piezoelectric element 13 is provided in the first blocking portion 123. That is, the second blocking portion 124 surrounds a periphery of the piezoelectric element 13 in a circumferential direction.

More specifically, the second blocking portion 124 is formed such that a cross-sectional area S of the second blocking portion 124 as viewed in cross section when the ultrasonic transducer Tr is cut along a plane including a minor axis direction (the Y direction in the present embodiment) and the Z direction satisfies the following Equation (1). In Equation (1), W is an opening width of the hole 111 of the ultrasonic transducer Tr in the minor axis direction, and γ is an aspect ratio of the hole 111, specifically, a length of the hole 111 in a major axis direction/a length W of the hole 111 in the minor axis direction. The cross-sectional area S of the second blocking portion 124 as viewed in cross section when the ultrasonic transducer Tr is cut along a plane including the major axis direction and the Z direction also satisfies Equation (1).

$$10\times(1+\gamma)\times W - 100 \leq S \leq (0.3\gamma + 0.21)\times W \quad (1)$$

The supporting portion 121 and the first blocking portion 123 are formed of, for example, a laminated body of $SiO_2$ and $ZrO_2$, and have a Young's modulus (a first Young's modulus) of 70 GPa or more.

On the other hand, the second blocking portion 124 is formed of, for example, an elastomer which is rubber, resin, or the like that has elasticity. A Young's modulus (a second Young's modulus) of the second blocking portion 124 is smaller than the first Young's modulus of the supporting portion 121 and the first blocking portion 123. The second Young's modulus may be 1 GPa to 10 GPa, and in the embodiment, a silicone rubber having a Young's modulus of approximately 3 GPa is used.

A relationship between a configuration of the blocking portion 122 of the vibration plate 12 and a resonance frequency of the ultrasonic transducer Tr will be described below in detail.

Configuration of Piezoelectric Element 13

The piezoelectric element 13 is provided at an opposite-side surface of the blocking portion 122 of the vibration plate 12 from the element substrate 11.

More specifically, as illustrated in FIGS. 3 and 4, the piezoelectric element 13 is provided in the first blocking portion 123 of the blocking portion 122. The piezoelectric element 13 is formed by sequentially laminating, on the vibration plate 12, a first electrode 131, a piezoelectric film 132, and a second electrode 133. A configuration in which the piezoelectric element 13 is laminated on the vibration plate 12 is shown. However, another layer may be provided between the piezoelectric element 13 and the vibration plate 12.

The piezoelectric element 13 expands and contracts when a voltage is applied between the first electrode 131 and the second electrode 133. When the piezoelectric element 13 expands and contracts, the blocking portion 122 of the vibration plate 12 provided with the piezoelectric element 13 vibrates, and the ultrasonic waves are transmitted from the ultrasonic transducer Tr.

When the ultrasonic waves are input from the hole 111 to the blocking portion 122, the blocking portion 122 vibrates, and a potential difference is generated above and below the piezoelectric film 132 of the piezoelectric element 13. Accordingly, reception of the ultrasonic waves can be detected by detecting the potential difference generated between the first electrode 131 and the second electrode 133.

Arrangement of Ultrasonic Transducers Tr

In the embodiment, as illustrated in FIG. 2, the plurality of ultrasonic transducers Tr are arranged in arrays along the X direction and the Y direction in the ultrasonic device 10.

In the embodiment, the first electrode 131 is formed linearly along the X direction, and is coupled to drive terminals 131P provided at ±X end portions. That is, in the ultrasonic transducers Tr adjacent in the X direction, the first electrode 131 is common, and forms one channel CH. A plurality of channels CH are arranged along the Y direction. Accordingly, independent drive signals can be input to the drive terminals 131P corresponding to the respective channels CH, and the respective channels CH can be individually driven.

On the other hand, as illustrated in FIG. 2, the second electrodes 133 are formed linearly in the Y direction, and ±Y side end portions of the respective second electrodes 133 are coupled to a common terminal 133P by being coupled to one another. These second electrodes 133 are electrically coupled to the drive circuit 30 via the common terminal 133P, and the same common potential is applied thereto.

Configuration of Control Unit 20

Returning to FIG. 1, the control unit 20 will be described.

The control unit 20 includes the drive circuit 30 that drives the ultrasonic device 10 and a calculation unit 40. The control unit 20 may include a storage unit that stores various types of pieces of data, various programs, and the like to control the ultrasonic apparatus 100.

The drive circuit 30 is a driver circuit configured to control driving of the ultrasonic device 10, and includes, for example, a reference potential circuit 31, a switching circuit 32, a transmission circuit 33, and a reception circuit 34 as shown in FIG. 1.

The reference potential circuit 31 is coupled to the common terminal 133P of the second electrode 133 of the ultrasonic device 10, and applies a reference potential to the second electrode 133.

The switching circuit 32 is coupled to the drive terminal 131P, the transmission circuit 33, and the reception circuit 34. The switching circuit 32 is a switching circuit, and is switched between transmission coupling of coupling the respective drive terminals 131P to the transmission circuit 33 and reception coupling of coupling the respective drive terminals 131P to the reception circuit 34.

The transmission circuit 33 is coupled to the switching circuit 32 and the calculation unit 40. When the switching circuit 32 is switched to the transmission coupling, the transmission circuit 33, based on a control by the calculation unit 40, outputs the drive signal having a pulse waveform to the respective ultrasonic transducer Tr, and transmits the ultrasonic waves from the ultrasonic device 10.

The arithmetic unit 40 includes, for example, a central processing unit (CPU). The arithmetic unit 40 controls the ultrasonic device 10 via the drive circuit 30, and performs transmission and reception processing of the ultrasonic waves by the ultrasonic device 10.

That is, the calculation unit 40 switches the switching circuit 32 to the transmission coupling, drives the ultrasonic device 10 from the transmission circuit 33, and performs the transmission processing of ultrasonic waves. The calculation unit 40 switches the switching circuit 32 to the reception coupling immediately after transmitting the ultrasonic waves, and receives, by the ultrasonic device 10, reflected waves reflected by the object. Then, the calculation unit 40 calculates the distance from the ultrasonic device 10 to the object by a time of flight (ToF) method using, for example, the time from the transmission timing at which the ultrasonic waves are transmitted from the ultrasonic device 10 to a time at which a reception signal is received and a sound velocity in the air.

Method of Manufacturing Ultrasonic Device 10

Figure 5:
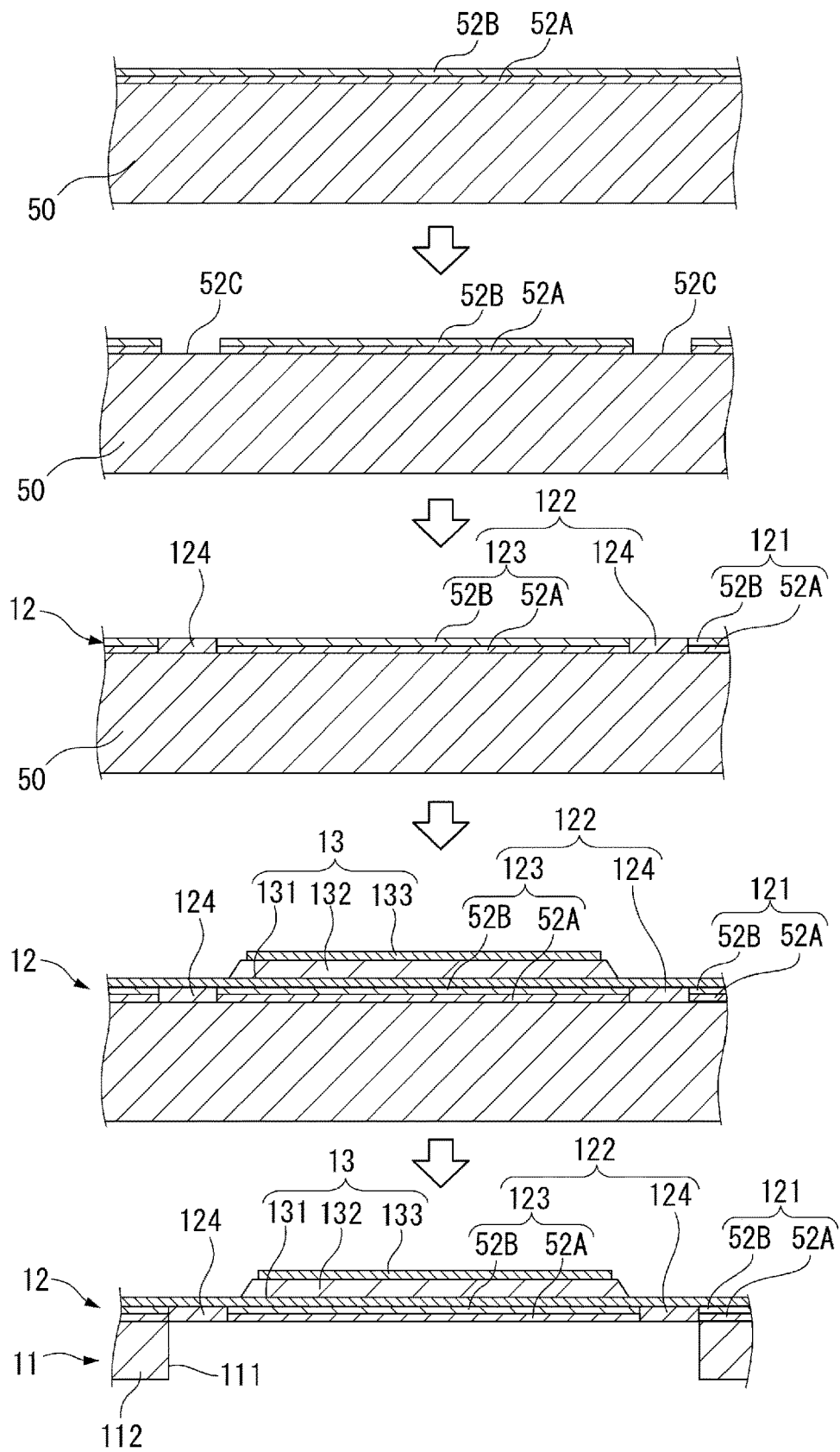
FIG. 5 illustrates a method of manufacturing the ultrasonic device according to the embodiment.

FIG. 5 illustrates a method of manufacturing the ultrasonic device 10 according to the embodiment.

In order to manufacture the ultrasonic device 10, first, a substrate formed of Si is used as the base material 50, and one surface of the base material 50 is thermally oxidized to form a $SiO_2$ film 52A. Then, a Zr film is formed on the $SiO_2$ film 52A, and is thermally oxidized. Accordingly, as illustrated in a first part of FIG. 5, a laminated body of the $SiO_2$ film 52A and a $ZrO_2$ film 52B is formed at the one surface of the base material 50.

Next, as illustrated in a second part of FIG. 5, a recessed portion 52C with respect to the laminated body of the $SiO_2$ film 52A and the $ZrO_2$ film 52B is formed at a position at which the second blocking portion 124 is formed. Specifically, a mask layer is formed at the surface of the base material 50, and is patterned such that the position at which the second blocking portion 124 is formed is opened. Then, an exposed portion of the laminated body of the $SiO_2$ film 52A and the $ZrO_2$ film 52B is etched to form the recess portion 52C.

Thereafter, the recessed portion 52C is filled with an elastomer which is a material that forms the second blocking portion 124. As a material that forms the second blocking portion 124, the elastomer having the second Young's modulus of 1 GPa to 10 GPa is used, and for example, silicone rubber or the like is used in the embodiment. Accordingly, as illustrated in a third part of FIG. 5, the vibration plate 12 including the blocking portion 122 and the supporting portion 121 is formed. The blocking portion 122 includes the first blocking portion 123 and the second blocking portion 124.

Thereafter, an electrode layer is formed on the vibration plate 12, and the electrode layer is patterned by etching to form the first electrode 131 and the drive terminal 131P (not illustrated). A piezoelectric material is laminated on the vibration plate 12, and is patterned by etching to form the piezoelectric film 132. Then, an electrode layer is formed on the vibration plate 12, and the electrode layer is patterned by etching to form the second electrode 133 and the common terminal 133P (not illustrated). Accordingly, the piezoelectric element 13 is formed as illustrated in a fourth part of FIG. 5.

Then, an opposite-side surface of the base material 50 from the vibration plate 12 is etched to form the hole 111, and the base material 50 is ground to a desired thickness to form the element substrate 11. Accordingly, the ultrasonic device 10 including the ultrasonic transducer Tr can be manufactured as illustrated in a fifth part of FIG. 5.

Vibration Preventing Effect of Ultrasonic Device 10

Next, the vibration preventing effect of the ultrasonic device 10 according to the embodiment will be described.

Figure 6:
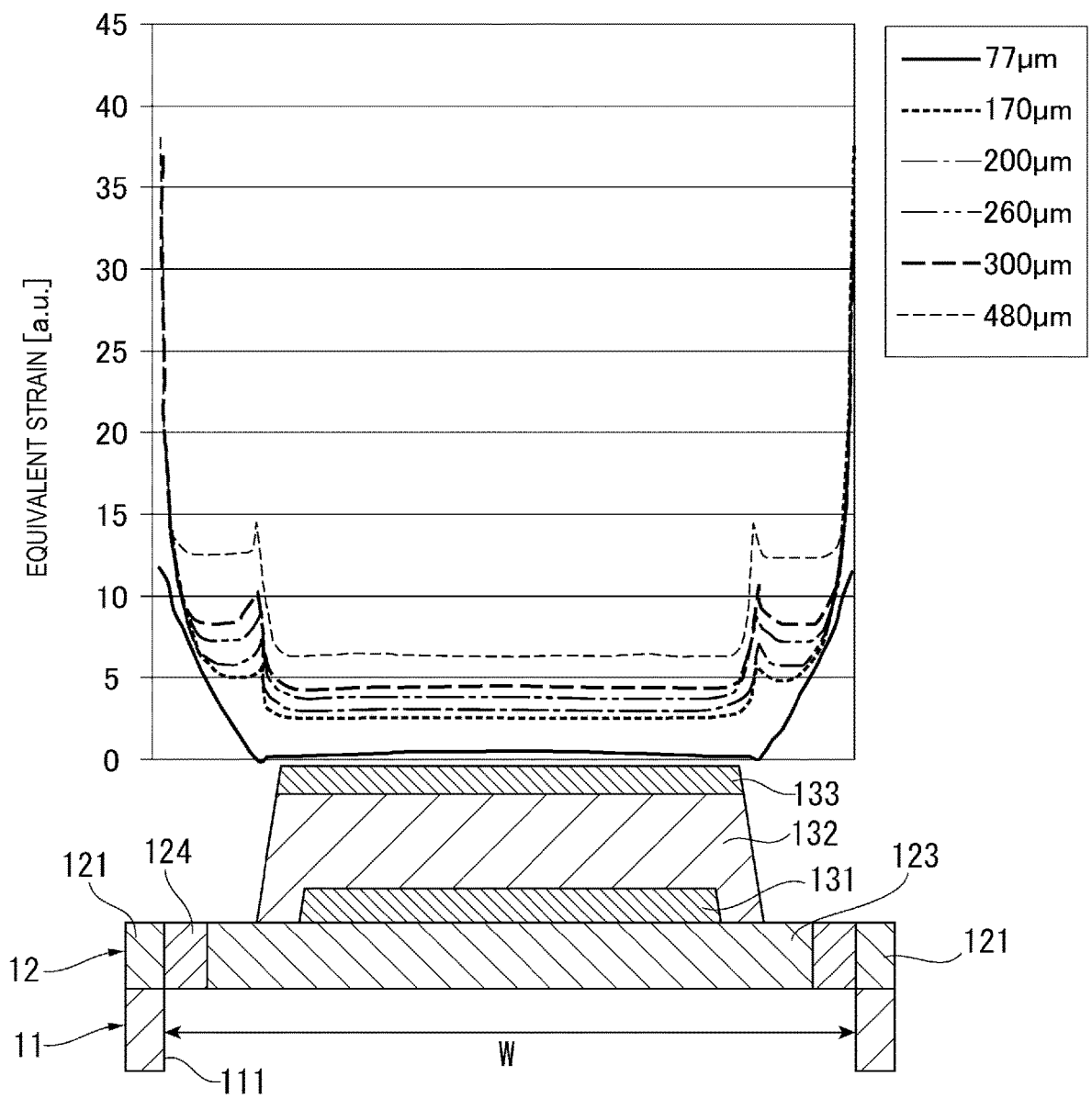
FIG. 6 shows an equivalent strain of a blocking portion when a drive signal is input to a piezoelectric element.

FIG. 6 shows an equivalent strain of the blocking portion 122 when the drive signal is input to the piezoelectric element 13. Curves in FIG. 6 show the equivalent strain when an opening width W of the hole 111 is 77 µm, 170 µm, 200 µm, 260 µm, 300 µm, and 480 µm, respectively.

As shown in FIG. 6, when the ultrasonic transducer Tr is driven, regardless of the opening width of the hole 111, the equivalent strain becomes the largest at a position inside an outer edge of the blocking portion 122 and along the outer edge, that is, at a boundary between the hole 111 and the wall portion 112.

Specifically, a range in which the equivalent strain increases is shown by Equation (1) from a boundary position between the blocking portion 122 and the supporting portion 121. In the embodiment, the second blocking portion 124 formed of an elastomer is provided in the range shown by Equation (1) from the boundary position between the blocking portion 122 and the supporting portion 121.

Accordingly, in the embodiment, vibration of the blocking portion 122 can be efficiently absorbed by the second blocking portion 124, and vibration energy of the vibration plate 12 can be converted into thermal energy by the second blocking portion 124. Accordingly, propagation (crosstalk) of vibration among the adjacent ultrasonic transducers Tr can be prevented. For example, when the ultrasonic transducer Tr of one channel CH is driven, the ultrasonic transducers Tr of the adjacent channels CH do not vibrate due to an influence of the crosstalk, and the ultrasonic waves can be transmitted from a desired channel.

In Equation (1), when $10 \times (1+\gamma) \times W - 100 \leq S$, efficiency of converting the vibration energy per unit area into the thermal energy is high with respect to a strain amount of the vibration plate 12. However, when $10 \times (1+\gamma) \times W - 100 > S$, the cross-sectional area S of the second blocking portion 124 is small, and the vibration energy of the vibration plate 12 cannot be sufficiently converted into the thermal energy. Therefore, the Q value increases and deformation efficiency of the blocking portion 122 also decreases.

When $(0.3\gamma + 0.21) \times W < S$, the vibration preventing effect of the vibration plate 12 can be attained, but the deformation efficiency of the blocking portion 122 decreases. On the other hand, the second blocking portion 124 is formed such that the cross-sectional area S shown in Equation (1) is attained. Accordingly, the vibration of the vibration plate 12 can be efficiently prevented, and the blocking portion 122 can be efficiently deformed.

Next, an influence of an increase of the second blocking portion 124 on the resonance frequency of the ultrasonic transducer Tr will be described by comparing the embodiment with a comparative example.

Figure 7:
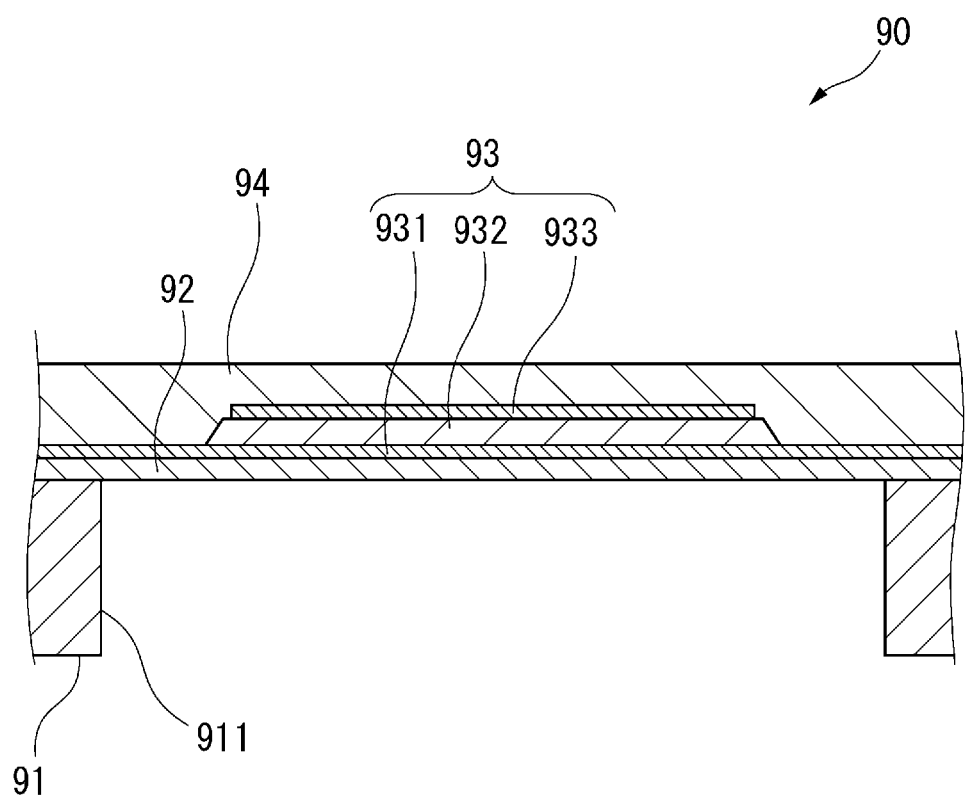
FIG. 7 is a cross-sectional view illustrating a schematic configuration of an ultrasonic device according to a comparative example.

FIG. 7 is a cross-sectional view illustrating a schematic configuration of an ultrasonic device according to the comparative example.

The ultrasonic device according to the comparative example includes an ultrasonic transducer 90 as illustrated in FIG. 7. That is, the ultrasonic transducer 90 includes an element substrate 91 including a hole 911, and a vibration plate 92 that is provided at one surface of the element substrate 91 and that is formed of a laminated body of a $SiO_2$ layer and a $ZrO_2$ layer. The hole 911 is blocked by the vibration plate 92. A piezoelectric element 93, in which a first electrode 931, a piezoelectric film 932, and a second electrode 933 are laminated, is provided at a position corresponding to the hole 911 of the vibration plate 92. A resin layer 94 covers the vibration plate 92 and the piezoelectric element 93 so as to reduce the influence of crosstalk.

Figure 8:
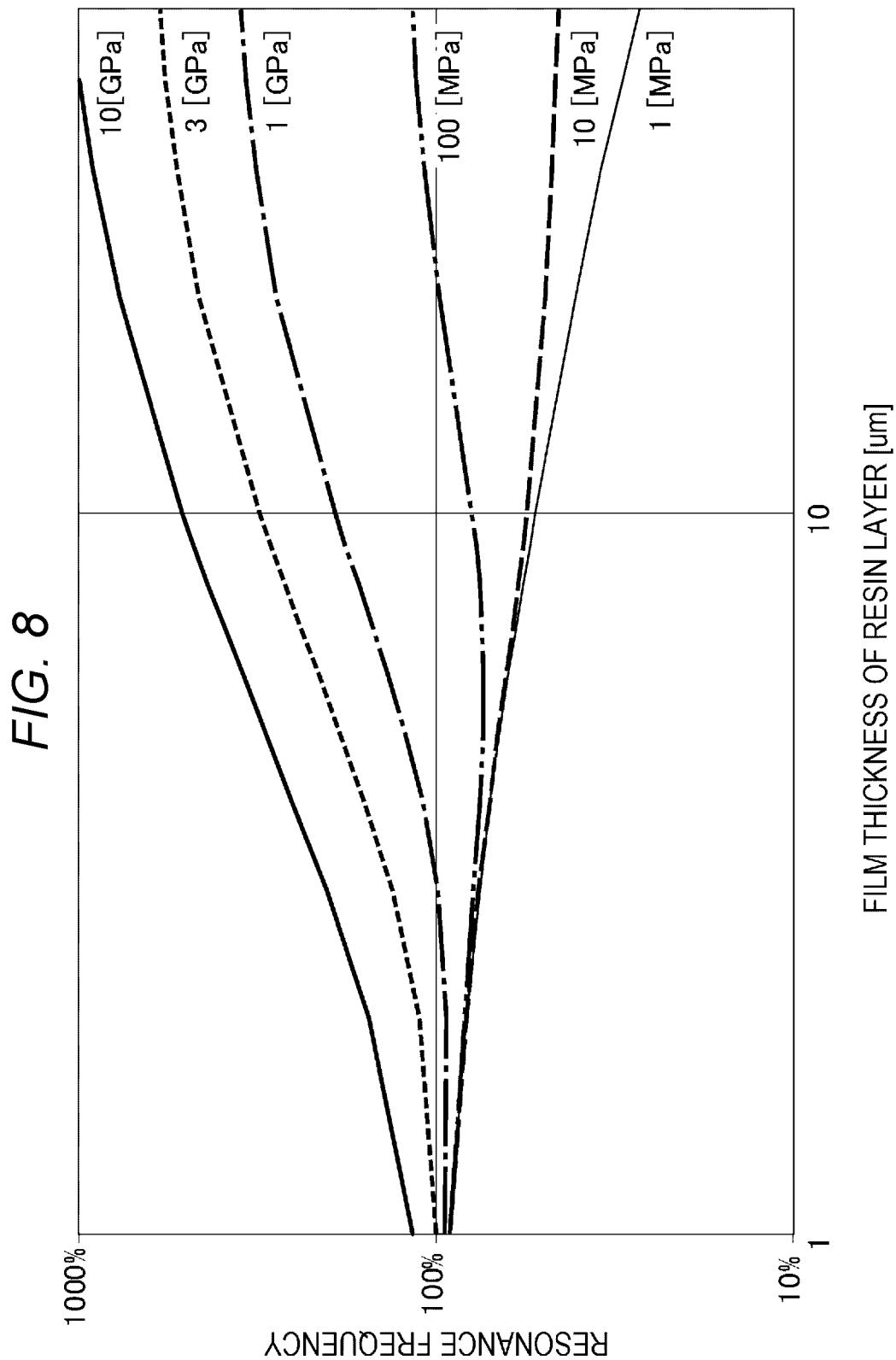
FIG. 8 shows a change of the ultrasonic device according to the comparative example in resonance frequency when a Young's modulus of a resin layer and a thickness of the resin layer are changed.

FIG. 8 shows a change of the ultrasonic device according to the comparative example in resonance frequency when a Young's modulus of the resin layer 94 and a thickness of the resin layer 94 are changed.

As shown in FIG. 8, when the Young's modulus of the resin layer 94 is small and is 10 MPa or less, the change of the ultrasonic transducer 90 in resonance frequency due to the change of the resin layer 94 in thickness is small.

However, when the Young's modulus of the resin layer 94 is 10 MPa or less, it becomes difficult to pattern the resin layer 94 in a desired shape. That is, when a signal line is connected to the piezoelectric element 93 provided in the ultrasonic transducer 90, it is necessary to etch the resin layer 94 such that electrode terminals connected to the first electrode 931 and the second electrode 933 are exposed. However, the resin layer 94 is too soft, so that accuracy of the etching process decreases. That is, a part at which the etching progresses fast and a part at which the etching progresses slowly may be generated, so that an etching pattern having a desired shape may not be formed, and reliability of the ultrasonic device may decrease.

On the other hand, the accuracy of the etching process can be improved by increasing the Young's modulus of the resin layer 94.

However, in order to prevent the vibration of the ultrasonic transducer 90 and effectively prevent the crosstalk, it is necessary to lower the Q value. In order to lower the Q value, it is necessary to increase the thickness of the resin layer 94.

However, when the resin layer 94 having a Young's modulus exceeding 100 MPa is used, as shown in FIG. 8, the resonance frequency of the ultrasonic transducer 90 becomes higher as the thickness of the resin layer 94 is increased, so that it becomes difficult to output ultrasonic waves having a desired frequency.

A frequency of the ultrasonic waves transmitted and received by the ultrasonic transducer 90 can be lowered by increasing an opening width of the hole 911. However, if the hole 911 is enlarged, an unnecessary vibration mode is generated when the vibration plate 92 is vibrated. That is, in order to output ultrasonic waves having a high sound pressure from the ultrasonic transducer 90, the vibration plate 92 may vibrate with an opening end of the hole 911 as a node and a central portion of the hole 911 as an antinode. The piezoelectric element 93 is provided at the central portion of the hole 911. However, when the unnecessary vibration mode is generated, a plurality of nodes and antinodes are generated in the vibration plate 92 that blocks the hole 911, and the sound pressure of the ultrasonic waves is reduced.

Figure 9:
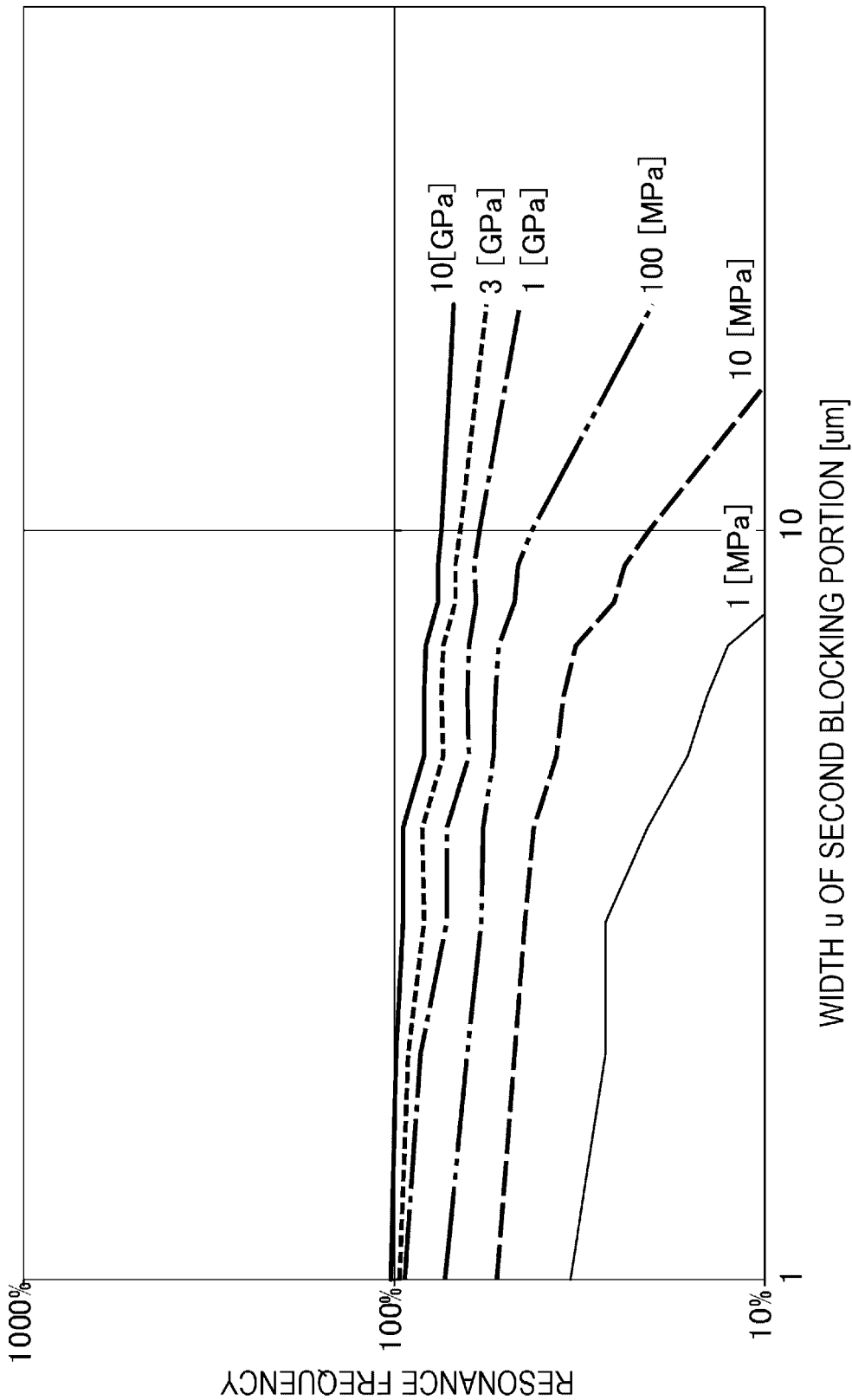
FIG. 9 shows a change of the ultrasonic device according to the embodiment in resonance frequency when a Young's modulus of a second blocking portion and a width of the second blocking portion are changed.

FIG. 9 shows a change of the ultrasonic device 10 according to the embodiment in resonance frequency when the Young's modulus of the second blocking portion 124 and a width u of the second blocking portion 124 are changed.

In the ultrasonic transducer Tr according to the embodiment, the second blocking portion 124 is a part of the vibration plate 12, and a thickness t thereof is the same as a thickness of the first blocking portion 123 or a thickness of the supporting portion 121. Therefore, FIG. 9 shows the change in resonance frequency when the width u of the second blocking portion 124 is changed.

As shown in FIG. 9, when the width u of the second blocking portion 124 is increased, the resonance frequency of the ultrasonic transducer Tr decreases regardless of the Young's modulus of the second blocking portion 124. In particular, at the Young's modulus in the range of 1 GPa to 10 GPa, the change in resonance frequency when the width u of the second blocking portion 124 is changed can be caused to be smaller, and a fluctuation in resonance frequency can be reduced.

FIG. 10 shows a resonance frequency and a Q value when the Young's modulus of the resin layer and the film thickness of the resin layer in the ultrasonic transducer 90 according to the comparative example are changed, and a resonance frequency and a Q value when the Young's modulus of the second blocking portion 124 and the width u of the second blocking portion 124 in the ultrasonic transducer Tr according to the embodiment are changed. In FIG. 10, the opening widths of the hole 911 according to the comparative example and the hole 111 according to the embodiment are fixed to 158 μm.

Comparative Example 1 in FIG. 10 shows a performance of the related-art ultrasonic transducer 90 in which the Young's modulus of the resin layer 94 is 30 MPa. In Comparative Example 1, the Q value is low and the resonance frequency is 415 KHz. However, in the ultrasonic transducer 90 according to Comparative Example 1, as described above, etching accuracy at a time of forming the resin layer 94 decreases, and reliability of the ultrasonic transducer 90 decreases.

Comparative Example 2 in FIG. 10 shows the performance of the related-art ultrasonic transducer 90 in which the Young's modulus of the resin layer 94 is 3000 MPa.

In the ultrasonic transducer 90 according to Comparative Example 2, the etching accuracy at the time of forming the resin layer 94 is improved, and the reliability of the ultrasonic transducer 90 is improved. However, in order to obtain a desired Q value, it is necessary to increase the thickness of the resin layer 94. For example, in order to obtain a Q value of approximately 30 to 60, the film thickness needs to be 3 μm or more. As the film thickness increases, the Q value decreases but rigidity of the ultrasonic transducer 90 increases. Therefore, the resonance frequency increases, and in examples shown in FIG. 10, is twice or more that in Comparative Example 1.

In order to attain the number of resonances around 400 kHz which is the same as that of the ultrasonic transducer 90 when the resin layer 94 having the Young's modulus of 30 MPa is used, it is necessary to further reduce the thickness of the resin layer 94, and in this case, the vibration preventing effect of the resin layer 94 is no longer attained.

On the other hand, in the embodiment, as shown in Comparative Examples 1 and 2, it is not necessary to perform highly accurate etching treatment to the second blocking portion 124, and a degree of freedom to select a material of the second blocking portion 124 is very high.

If the second blocking portion 124 is formed of resin having the same Young's modulus of 3000 MPa as that in Comparative Example 2, as shown in FIG. 10, the resonance frequency of the ultrasonic transducer Tr is approximately 400 kHz regardless of the width u of the second blocking portion 124. That is, the fluctuation in resonance frequency due to the width u of the second blocking portion 124 can be reduced.

In the embodiment, as shown in FIGS. 9 and 10, when the width u of the second blocking portion 124 is increased, the resonance frequency decreases. Therefore, it is possible to obtain the ultrasonic transducer Tr, in which the desired resonance frequency and the desired Q value are obtained, by changing the width u of the second blocking portion 124 without changing the opening width of the opening 111.

Advantage of Embodiment

In the embodiment, the ultrasonic apparatus 100 includes the ultrasonic device 10 and the control unit 20 configured to control the ultrasonic device 10. The ultrasonic device 10 includes the element substrate 11 including the first surface 11A and the opposite-side second surface 11B of the element substrate 11 from the first surface 11A, the vibration plate 12 provided at the first surface 11A of the element substrate 11, and the piezoelectric element 13 laminated at the vibration plate 12. The element substrate 11 includes the hole 111 provided from the first surface 11A to the second surface 11B and the wall portion 112 surrounding the hole 111. The vibration plate 12 includes, when viewed in the Z direction from the first surface 11A toward the second surface 11B, the supporting portion 121 overlapping the wall portion 112, and the blocking portion 122 that overlaps the hole 111 and blocks the hole. The piezoelectric element 13 is laminated at the blocking portion 122. In the embodiment, the supporting portion 121 has the first Young's modulus. The blocking portion 122 includes the first blocking portion 123 having the first Young's modulus and the second blocking portion 124 having the second Young's modulus smaller than the first Young's modulus.

In this configuration, the second Young's modulus of the second blocking portion 124 is smaller than the first Young's modulus of the supporting portion 121 and the first blocking portion 123, so that the vibration of the blocking portion 122 can be prevented by the second blocking portion 124. Accordingly, it is possible to prevent an inconvenience that the vibration propagates from one ultrasonic transducer Tr to another ultrasonic transducer Tr. At this time, in the embodiment, when the width of the second blocking portion 124 is increased, the resonance frequency does not fluctuate excessively.

Even when the width of the second blocking portion 124 is increased to set the Q value to a desired value, the resonance frequency of the ultrasonic transducer Tr decreases. Accordingly, it is not necessary to increase the opening width of the hole 111. Conversely, the hole 111 may be narrowed. In this case, there is no inconvenience that the unnecessary vibration mode is generated when the blocking portion 122 is vibrated. Accordingly, when the ultrasonic waves are transmitted, the ultrasonic waves having the large sound pressure can be transmitted from the respective ultrasonic transducers Tr, and when the ultrasonic waves are received, a reception signal having a large signal voltage can be obtained.

When the resin layer 94 is provided so as to attain the vibration preventing effect as the ultrasonic transducer 90 shown in the comparative example, an etching step for exposing the electrode terminal to input and output a signal to and from the piezoelectric element 13 is required. In the etching step, the etching accuracy changes depending on the Young's modulus of the resin layer 94, and an inconvenience that, for example, the resin layer remains at the electrode terminal may occur, so that the reliability of the ultrasonic device may decrease.

On the other hand, in the embodiment, the step of etching the resin layer as described above is not necessary, so that the reliability of the ultrasonic device 10 does not decrease due thereto, and the degree of freedom of the material used for the second blocking portion 124 can be widened.

In the embodiment, the second blocking portion 124 is provided in contact with a boundary between the blocking portion 122 and the supporting portion 121.

Therefore, the second blocking portion 124 is provided at a part at which the equivalent strain becomes the largest when the blocking portion 122 vibrates, so that the vibration energy of the blocking portion 122 can be effectively converted into the thermal energy. Accordingly, the vibration of the blocking portion 122 can be effectively prevented, and an occurrence of the crosstalk can be prevented.

At this time, the second blocking portion 124 is formed to have the cross-sectional area S satisfying the above-described Equation (1).

Accordingly, the second blocking portion 124 is provided at a position at which the equivalent strain becomes the largest when the blocking portion 122 vibrates, so that the vibration of the blocking portion 122 can be more effectively prevented.

In the embodiment, the second blocking portion 124 is provided at a peripheral edge of the piezoelectric element 13 when viewed from the Z direction. That is, the second blocking portion 124 is provided along peripheral edges of the opening 111 and the piezoelectric element 13 in the circumferential direction.

Accordingly, the propagation of the vibration of the blocking portion 122 in respective directions can be prevented.

In particular, in the ultrasonic device 10 according to the embodiment, the plurality of ultrasonic transducers Tr are arranged in arrays along the X direction and the Y direction. In this configuration, when the blocking portion 122 of one ultrasonic transducer Tr vibrates, other ultrasonic transducers Tr adjacent to the one ultrasonic transducer Tr in the X direction and the Y direction may be affected by the crosstalk. In the embodiment, the second blocking portion 124 surrounds the piezoelectric element 13, so that the propagation of the vibration of the blocking portion 122 in the X direction and the Y direction can be prevented. That is, it is possible to effectively prevent the crosstalk among the plurality of ultrasonic transducers Tr arranged in arrays.

In the embodiment, the first blocking portion 123 is formed of the laminated body of $SiO_2$ and $ZrO_2$, and the second blocking portion 124 is formed of an elastomer.

The first blocking portion 123 and the supporting portion 121 that include the $SiO_2$ layer can be easily formed by thermally oxidizing a Si substrate, so that manufacturing efficiency can be improved.

A Young's modulus of $SiO_2$ is 70 GPa or more and the second blocking portion 124 is an elastomer which is resin, rubber, or the like, so that the Young's modulus of the second blocking portion 124 can be caused to be smaller than that of the first blocking portion 123 and that of the supporting portion 121, and the vibration preventing effect as described above can be attained.

Modification

The present disclosure is not limited to the above-described embodiments and modifications, and includes configurations obtained by modifications, improvements, appropriate combinations of the embodiments, and the like as long as aspects of the present disclosure can be achieved.

Modification 1

In the above-described embodiment, a configuration is exemplified in which the second blocking portion 124 is provided in contact with the boundary between the supporting portion 121 and the blocking portion 122, but the present disclosure is not limited thereto.

For example, the second blocking portion 124 may be provided at a position closer to the piezoelectric element 13 with a predetermined dimension than the boundary between the supporting portion 121 and the blocking portion 122.

An example in which the second blocking portion 124 is formed to have the cross-sectional area S based on Equation (1) is shown. However, if the second blocking portion 124 is formed at a position not overlapping the piezoelectric element 13 in the blocking portion 122, the cross-sectional area S may deviate from Equation (1), and even in this case, a certain vibration preventing effect can be attained.

Modification 2

In the above-described embodiment, the second blocking portion 124 surrounds the piezoelectric element 13 and is provided along the circumferential direction of the hole 111, but the present disclosure is not limited thereto.

The second blocking portion 124 may be provided in a direction in which the vibration propagation is prevented. For example, in an ultrasonic device having a one-dimensional array structure in which the plurality of ultrasonic transducers Tr are arranged at the hole 111 in the minor axis direction, the second blocking portion 124 may be provided at a position at which the piezoelectric element 13 is sandwiched in the minor axis direction. Similarly, when the plurality of ultrasonic transducers Tr are arranged in the hole 111 along the major axis direction, the second blocking portion 124 may be provided at a position at which the piezoelectric element 13 is sandwiched in the major axis direction.

Modification 3

In the above-described embodiment, one channel CH is a single row of ultrasonic transducers Tr arranged in the X direction. However, for example, the channel CH may be the plurality of ultrasonic transducers Tr arranged in the X direction and the Y direction.

A plurality of channels CH are arranged along the Y direction. However, the plurality of channels CH may be arranged along the Y direction, or the plurality of channels CH may be arranged in the X direction and the Y direction.

An example in which one channel CH includes the plurality of ultrasonic transducers Tr is shown. However, the plurality of ultrasonic transducers Tr may be independently driven.

Modification 4

In the example shown in FIG. 6, the second blocking portion 124 is provided between an opening edge of the hole 111 and an intermediate position between the opening edge and the piezoelectric element 13. On the other hand, the second blocking portion 124 may be provided from the opening edge of the hole 111 to the peripheral edge of the piezoelectric element 13.

When the ultrasonic transducer Tr is driven, as shown in FIG. 6, the equivalent strain becomes the largest at the position inside the outer edge of the blocking portion 122 and along the outer edge, and then the equivalent strain becomes larger at a position of the peripheral edge of the piezoelectric element 13. Accordingly, the second blocking portion 124 is provided up to the peripheral edge of the piezoelectric element 13, so that the vibration energy of the blocking portion 122 can be effectively converted into the thermal energy.

Modification 5

In the above-described embodiment, a configuration is exemplified in which the element substrate 11, which is a base member, includes the first surface 11A and the opposite-side second surface 11B of the element substrate 11 from the first surface 11A, but the present disclosure is not limited thereto.

For example, the base member may be a block-shaped member, and the second surface may be a surface that is continuous from the first surface and intersects the first surface at a predetermined angle.

What is claimed is:

1. An ultrasonic device comprising:
a base member including a first surface and a second surface different from the first surface;
a vibration plate provided at the first surface of the base member; and
a piezoelectric element provided at the vibration plate, wherein
the base member includes a hole formed from the first surface to the second surface, and a wall portion surrounding the hole,
the vibration plate includes, when viewed in a direction from the first surface toward the second surface, a supporting portion overlapping the wall portion, and a blocking portion that overlaps the hole and blocks the hole and in which the piezoelectric element is provided,
the supporting portion has a first Young's modulus, and
the blocking portion includes a first blocking portion having the first Young's modulus and a second blocking portion having a second Young's modulus smaller than the first Young's modulus.

2. The ultrasonic device according to claim 1, wherein the second blocking portion is provided in contact with a boundary between the blocking portion and the supporting portion.

3. The ultrasonic device according to claim 1, wherein the second blocking portion is provided at a peripheral edge of the piezoelectric element when viewed from the direction from the first surface toward the second surface.

4. The ultrasonic device according to claim 1, wherein $10\times(1+\gamma)\times W-100 \leq S \leq (0.3\gamma+0.21)\times W$, wherein $\gamma$ is an aspect ratio when the hole is viewed from the direction from the first surface toward the second surface, W is an opening width in a minor axis direction when the hole is viewed from the direction from the first surface toward the second surface, and S is a cross-sectional area that is a product of a thickness of the second blocking portion in the direction from the first surface toward the second surface and a width of the second blocking portion in the minor axis direction.

5. The ultrasonic device according to claim 1, wherein the first blocking portion includes $SiO_2$, and
the second blocking portion is formed of an elastomer.

6. The ultrasonic device according to claim 1, wherein the base member includes a plurality of the holes, and
the vibration plate includes a plurality of the blocking portions corresponding to the respective holes.

7. An ultrasonic apparatus comprising:
the ultrasonic device according to claim 1; and
a control unit configured to control the ultrasonic device.

* * * * *